United States Patent [19]

Huizer

[11] Patent Number: 4,637,039
[45] Date of Patent: Jan. 13, 1987

[54] FREQUENCY DIVIDER CIRCUIT ARRANGEMENT

[75] Inventor: Cornelis M. Huizer, Eindhoven, Netherlands

[73] Assignee: U. S. Philips Corporation, New York, N.Y.

[21] Appl. No.: 698,990

[22] Filed: Feb. 7, 1985

[30] Foreign Application Priority Data

Feb. 24, 1984 [GB] United Kingdom ............... 8404886

[51] Int. Cl.$^4$ ........................................... H03K 23/60
[52] U.S. Cl. ................................... 377/121; 377/105; 377/117
[58] Field of Search ............... 377/115, 121, 117, 105, 377/104

[56] References Cited

U.S. PATENT DOCUMENTS 3,252,009  5/1966  Weimer ............................... 377/105
3,996,478 12/1976  Kasaerkovitz ....................... 377/104
4,156,819  5/1979  Takahashi et al. ................... 377/117

Primary Examiner—John S. Heyman
Attorney, Agent, or Firm—Thomas A. Briody; William J. Streeter; Leroy Eason

[57] ABSTRACT

In order to reduce the likelihood of incorrect states being transferred from one cross-coupled transistor pair to the next in a frequency divider which comprises at least two such pairs (6a, 7a and 8a, 9a) which are energized alternately by means of a switchable current source arrangement (5) and which are inter-coupled to form a cyclic arrangement by means of data transfer transistors (6b, 7b, 8b and 9b) energized from the same outputs (22, 23) of the current source arrangement, the transistors employed are of the insulated gate field effect type. The channel width-to-length ratios of the pair transistors (6a, 7a, 8a, 9a) may be chosen to be different from the corresponding ratios for the data transfer transistors (6b, 7b, 8b, 9b) in order to improve either the high-frequency or the low frequency performance in accordance with the sign of such difference.

2 Claims, 2 Drawing Figures

FREQUENCY DIVIDER CIRCUIT ARRANGEMENT

BACKGROUND OF THE INVENTION

1. Field of the Invention

This invention relates to a frequency divider circuit arrangement comprising 2n subcircuits inter-coupled to form a cyclic arrangement, where n is a positive integer, and switchable current source means, each subcircuit comprising first, second, third and fourth transistor structures each having a control electrode, an output electrode and a common electrode, in each subcircuit the output electrode of the first structure being provided with a load impedance and being coupled to the control electrodes of the second and fourth structures, the output electrode of the second structure being provided with a load impedance and being coupled to the control electrodes of the first and third structures, and the common electrodes of all four structures being connected to a common point, the intercouplings between said subcircuits comprising, for each of said subcircuits except one, a coupling from the output electrode of the third structure of the relevant subcircuit to the output electrode of the first structure of the next subcircuit in the cyclic arrangement and a coupling from the output electrode of the fourth structure of the relevant subcircuit to the output electrode of the second structure of the next subcircuit in the cyclic arrangement, and for the other one of said subcircuits a coupling from the output electrode of the fourth structure of the relevant subcircuit to the output electrode of the first structure of the next subcircuit in the cyclic arrangement and a coupling from the output electrode of the third structure of the relevant subcircuit to the output electrode of the second structure of the next subcircuit in the cyclic arrangement, said switchable current source means having first and second outputs and being constructed to supply current thereat alternately in response to the application of an input signal to said switchable current source means, the said common points of the successive said subcircuits in the cyclic arrangement being constituted by alternate ones of said first and second outputs and an output electrode of a said first structure being coupled to an output of said circuit arrangement.

2. Description of the Related Art

Such an arrangement, which will be referred to hereinafter as an arrangement of the kind set forth, is known, for example, from U.S. Pat. No. 4,315,165, issued Feb. 9, 1982 and the arrangement shown in FIG. 4 thereof is reproduced in FIG. 1 herein.

The frequency divider circuit arrangement in FIG. 1 comprises 2n subcircuits 1, 2, 3 and 4 respectively, and switchable current source means 5. The 2n subcircuits, where n=2 in the present case, are intercoupled to form a cyclic arrangement 1-2-3-41 etc. Each subcircuit comprises four transistor structures which in FIG. 1 are npn bipolar double-collector transistors. Thus, as far as subcircuit 1 is concerned, the first second, third and fourth transistor structures are constituted by the emitter, base and upper (in the drawing) collector zones of a double-collector transistor 6, the emitter, base and upper collector zones of a double-collector transistor 7, the emitter, base and lower collector zones of transistor 6 and the emitter, base and lower collector zones of transistor 7 respectively. Similarly, the first, second, third and fourth transistor structures are constituted in subcircuit 2 by transistor 8 (upper collector), transistor 9 (upper collector), transistor 8 (lower collector) and transistor 9 (lower collector) respectively; in subcircuit 3 by transistor 10 (upper collector), transistor 11 (upper collector), transistor 10 (lower collector) and transistor 11 (lower collector) respectively; and in subcircuit 4 by transistor 12 (upper collector), transistor 13 (upper collector), transistor 12 (lower collector) and transistor 13 (lower collector) respectively. In each subcircuit 1, 2, 3 and 4 the output electrode (collector) of the first structure is provided with a load impedance (resistors 14, 15, 16 and 17 respectively) and is coupled (in the present case directly connected) to the control electrodes (bases) of the second and fourth structures, i.e. to the base of transistor 7, transistor 9, transistor 11 and transistor 13 respectively. Moreover, in each subcircuit 1, 2, 3 and 4 the output electrode (collector) of the second structure is provided with a load impedance (resistors 18, 19, 20 and 21 respectively) and is coupled (in the present case directly connected) to the control electrodes (bases) of the first and third structures, i.e. to the base of transistor 6, transistor 8, transistor 10 and transistor 12 respectively. In each circuit the common electrodes or emitters of the relevant four structures are commoned. Thus the emitters of transistors 6 and 7 are interconnected, as are those of transistors 8 and 9, 10 and 11, and 12 and 13. The intercouplings between the subcircuits comprise, for each of these subcircuits except subcircuit 4, a coupling from the collector of the third structure of the relevant subcircuit, i.e. from the lower collectors of the transistors 6, 8 and 10 respectively, to the collector of the first structure of the next subcircuit in the cyclic arrangement, i.e. to the upper collectors of the transistors 8, 10 and 12 respectively, and a coupling from the collector of the fourth structure of the relevant subcircuit, i.e. from the lower collectors of the transistors 7, 9 and 11, to the collector of the second structure of the next subcircuit in the cyclic sequence, i.e. to the upper collectors of the transistors 9, 11 and 13 respectively. For the subcircuit 4 the corresponding couplings are from the collector of its fourth structure (lower collector of transistor 13) and from the collector of its third structure (lower collector of transistor 12) to the collector of the first structure of subcircuit 1 (upper collector of transistor 6) and to the collector of the second structure of subcircuit 1 (upper collector of transistor 7) respectively.

The switchable current source has first and second outputs 22 and 23 respectively and is constructed to supply current thereat alternately in response to the application of an input signal to the means 5. To this end it comprises a current source 24 which is fed from a supply terminal 25, and npn transistors 26 and 27 the emitters of which are connected to the output of source 24 and the collectors of which are connected to the outputs 22 and 23 respectively. In operation the input signal is applied in antiphase to input terminals 28 and 29 (or to one of the terminals 28 and 29 if the other is held at a reference potential). These terminals are connected to the bases of the transistors 26 and 27 respectively, so that transistor 26 and 27 are rendered conductive alternately, conducting the output current of source 24 to the terminals 22 and 23 alternately.

The emitters of the transistor structures of the successive subcircuits 1, 2, 3 and 4 in the cyclic arrangement are connected to alternate ones of the outputs 22 and 23. Thus the emitters of transistors 6 and 7 are connected to terminal 23, the emitters of transistors 8 and 9 are connected to terminal 22, the emitters of transistors 10 and 11 are connected to terminal 23, and the emitters of transistors 12 and 13 are connected to terminal 22.

The collectors of the first and second transistor structures of subcircuit 4, i.e. the upper collectors of transistors 12 and 13, are connected to output terminals 32 and 31 respectively, at which an output signal appears in antiphase in operation.

The load resistors 14–21 are connected to a supply terminal 30 which, in operation, is held at a positive supply voltage relative to terminal 25.

The first and second transistor structures of each subcircuit which structures include the upper collectors of the relevant double-collector transistors are, as will be seen, connected as respective cross-coupled differential pairs which therefore each take up one of two possible stable states when they are energized, i.e. when they are supplied with current from the terminal 22 or 23 to which they are connected.

The third and fourth transistor structures of each subcircuit (which structures include the lower collectors of the relevant double-collector structure) are driven in parallel with the corresponding first and second structures respectively, and constitute data transfer transistor structures for priming the next subcircuit in the cyclic sequence to take up, when it is next energized, a stable state which is determined by the current state of the subcircuit which immediately precedes it in the cyclic sequence. Thus, for example, if transistor 27 is conductive and subcircuit 1 is in a state in which transistor 6 is conductive and transistor 7 is cut-off, the upper collector of transistor 8 and hence the base of transistor 9 will be held low by the low potential at the lower collector of transistor 6, and the upper collector of transistor 9 and hence the base of transistor 8 will be held high by the high potential on the lower collector of transistor 7, with the result that when subcircuit 2 is subsequently energized by conduction in transistor 26 (and subcircuit 1 is deenergized) subcircuit 2 will be biassed to take up a stable state in which transistor 8 is conducting and transistor 9 is cut off. The result of this is that a given initial state of, say, subcircuit 1 is transferred in turn to subcircuits 2, 3 and 4 in step with successive half-cycles of the input signal. Because the coupling from subcircuit 4 to subcircuit 1 is effectively reversed as compared with the other couplings between subcircuits the state then transferred from subcircuit 4 to subcircuit 1 is the opposite one to the initial state. The result is that the potentials at the upper collectors of transistors 13 and 12, and hence the output terminals 31 and 32, change in opposite senses after every four half-cycles of the input signal, resulting in frequency division by four.

It has been found that such an arrangement is, particularly when the input signal applied to switchable current source means 5 changes sinusoidally, liable to operate in a less than satisfactory manner. More particularly the sub-circuits are liable to take up, when energized, states which are the opposite to those which they are primed to take up by the preceding subcircuits in the sequence, with the result that the arrangement ceases to function in the manner intended and desired. It is an object of the invention to mitigate this disadvantage.

The aforementioned unsatisfactory behaviour of the known arrangement arises largely because of non-ideal sharing of the output currents of the switchable current source means between the various transistor structures, and this problem can be mitigated, in accordance with the invention if the bipolar transistor structures are replaced by insulated-gate field-effect transistor structures. More specifically, when a given subcircuit becomes energized in the known arrangement one of its first and second transistor structures whose collector is currently held at a relatively low potential and whose base is currently held at a relatively high potential by the preceding subcircuit in the cyclic arrangement is in a saturated state. In some states of the circuit arrangement this situation will coincide with the collector of that one of the third and fourth transistor structures of the relevant subcircuit whose base is also held at a relatively high potential by the preceding subcircuit in the cyclic arrangement being at a relatively high potential. The result of this is that energization of the relevant subcircuit results initially in most of the current drawn thereby from the switchable current source means being taken by the saturated one of the third and fourth transistor structures of the relevant sub-circuit, with the result that its collector potential drops, taking with it the bases of the two transistor structures in the next subcircuit to which it is coupled, which subcircuit is simultaneously being deenergized and having its state transferred to the next but one subcircuit in the cyclic arrangement. If the switching of the output current of the switchable current source means from one of its output to the other occurs rather slowly, for example because the input signal is a sine-wave rather than a square wave, the said next subcircuit will still be partly energized and consequently tend to have its state reversed because of the aforesaid conduction in the relevant one of the third and fourth transistor structures of the first-mentioned subcircuit. If when this occurs the said next-but-one subcircuit has not locked into its required state (which is very possible because that one of its first and second transistor structures which should conduct is itself saturated at the start of the switching process) it is quite likely to eventually lock into an incorrect state.

As an example of the above suppose the circuit of FIG. 1 is in a state which transistor 26 cut off, transistor 27 conductive, and with the potentials in the four subcircuits conforming with those indicated by the letters H and L (which denote relatively high and relatively low potentials respectively). Thus subcircuits 1 and 3 are energized and transistors 6 and 11 are conducting. The next correct state (with subcircuits 2 and 4 energized) is with transistors 8 and 13 conducting. Suppose now that transistor 27 is turned off rather slowly and transistor 26 is simultaneously turned on rather slowly (for example because the input signal applied in antiphase to terminals 28 and 29 is sinusoidal). Of the four transistor structures in subcircuits 2 and 4 which are required to become conductive only that corresponding to the lower collector of transistor 8 is not initially saturated, with the result that initially this structure draws substantially all of the current from transistor 26 and the gain in the flip-flop formed by the intercoupled first and second structures in sub-circuit 4 is very low. Thus the potential on the lower collector of transistor 8 drops, taking with it the base of transistor 11 and tending to drive subcircuit 3 (which is still partly energized at this time) into an indeterminate state in which transistors 10 and 11 are both conductive to some extent. This indeterminate state is in turn transmitted to subcircuit 4 which is in consequence liable to take up a state in which transistor 12 is conducting rather than transistor 13 when it eventually locks.

Thus a significant reason that the known arrangement fails to operate satisfactorily under certain conditions is that the currents supplied by the switchable current source means are not always shared in the desired manner between the various transistor structures, because due to saturation effects one data transfer transistor structure is liable to draw current at the expense of the or each cross-coupled differential transistor pair will be supplied from the same output of another current source means, this effect being exacerbated by the exponential characteristics of bipolar transistors, with the result that data transferred is liable to become indeterminate or even inverted before the differential pair to which it is transferred actually locks into a stable state.

SUMMARY OF THE INVENTION

According to the invention an arrangement of the kind described above is characterized in that each said transistor structures is an insulated gate field effect transistor, said control, output and common electrodes being gate, drain and source electrodes of the relevant transistor. The operation of such an arrangement under the adverse conditions referred to is considerably more reliable because insulated-gate field-effect transistor structures (a) do not exhibit saturation effects and (b) have characteristics which are merely quadratic, as opposed to the exponential characteristics of bipolar transistors.

It should be noted that an alternative way of overcoming the current-sharing problems would be to separate the current supplied to the differential pairs from those to the corresponding data transfer transistors, for example by providing the switchable current source means with third and fourth outputs at which currents appear in synchronism with the appearance of the currents at the first and second outputs respectively but independently of the latter currents, and supplying the two sets of data transfer transistor structures from the third and fourth outputs respectively instead of from the first and second outputs respectively. This could be done by providing a second circuit identical to that denoted by 5 in FIG. 1 and driven in synchronism therewith (and would of course also require the separation of each double-collector transistor structure into a pair of single-collector transistor structures) to yield a circuit as disclosed (in a frequency divider-by-two version) in, for example, the article "Frequency-dividers for ultra-high frequencies" by W. D. Kasperkovitz in Philips Techn. Rev. 38, 1978/1979, no. 2, pages 54–68, particularly in FIG. 2 on page 56. However the provision of two further switching transistors in the switchable current source means is undesirable.

If the first and second transistor structures on the one hand and the third and fourth transistor structures on the other hand share the current of one single current source, the width-to-length ratios of the channels of the same determine this current sharing. The width-to-length ratios of the channels of all the first and second transistor structures may differ from the width-to-length ratios of all the third and fourth transistors in the same sense. It has been found that, by arranging that this is the case, the operation of the arrangement can be optimised for a particular use. In general it has been found that if these ratios for the first and second structures are made larger than those for the third and fourth structures the high-frequency sensitivity and the maximum operating frequency of the arrangement are increased.

BRIEF DESCRIPTION OF THE DRAWINGS

An embodiment of the invention will now be described, by way of example, with reference to the accompanying diagrammatic drawings, in which.

DESCRIPTION OF THE PREFERRED EMBODIMENTS

Figure 1:
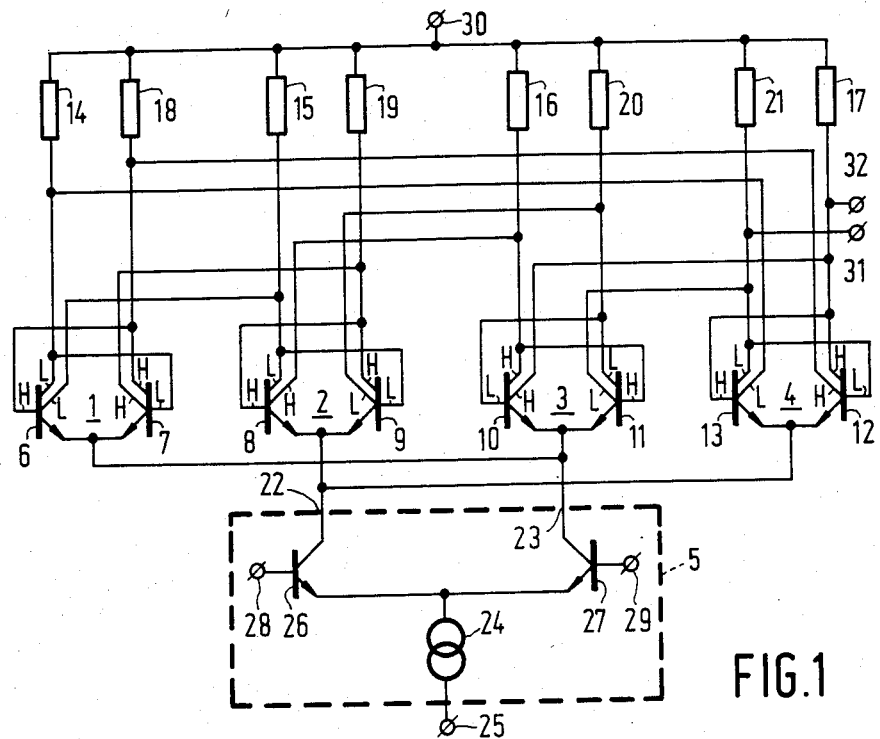
FIG. 1 is the circuit diagram of the known arrangement previously referred to, FIG. 2 is the circuit diagram of a frequency divider in accordance with the invention.
Figure 2:
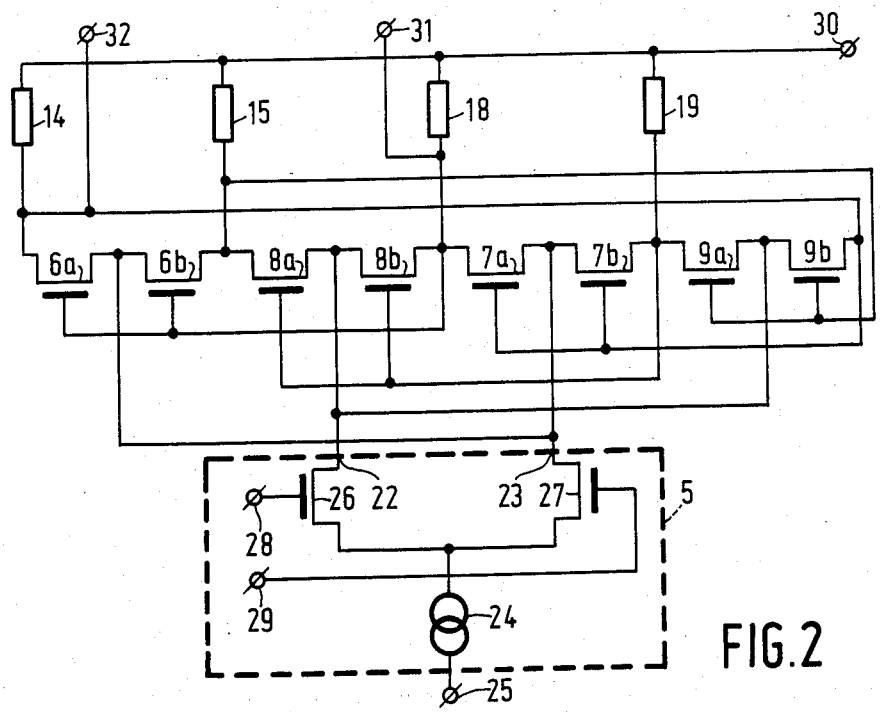
FIG. 2a shows the structure of a typical N channel enhancement mode insulated gate field effect transistor.

In FIG. 2, in which corresponding components have been given the same reference numerals as their counterparts in FIG. 1, the transistor structures corresponding to the upper and lower collectors of the double-collector transistors of FIG. 1 being given the suffixes a and b respectively, a frequency divider-by-two circuit arrangement comprises first and second subcircuits interconnected to form a cyclic arrangement, and switchable current source means 5. The first subcircuit comprises first, second, third and fourth enhancement-type insulated gate field effect transistor structures $6a$, $7a$, $6b$ and $7b$ respectively and output electrode or drain load resistors 14 and 18 for the structures $6a$ and $7a$ respectively. Similarly the second subcircuit comprises first, second, third and fourth enhancement type insulated gate field effect transistor structures $8a$, $9a$, $8b$ and $9b$ respectively and output electrode or drain load resistors 15 and 19 for the structures $8a$ and $9a$ respectively. The drains of transistors $6a$, $7a$, $8a$ and $9a$ are connected to the control electrodes or gates of transistors $7a$ and $7b$, transistors $6a$ and $6b$, transistors $9a$ and $9b$ transistors $8a$ and $8b$ respectively. The common electrodes or sources of the transistors $6a$, $6b$, $7a$ and $7b$ are commoned and connected to the output 23 of current source means 5, and the common electrodes or sources of the transistors $8a$, $8b$, $9a$ and $9b$ are commoned and connected to the output 22 of the current source means 5. The intercouplings between the sub-circuits comprise a connection from the output electrode or drain of transistor $6b$ to the drain of transistor $8a$, a connection from the output electrode or drain of transistor $7b$ to the drain of transistor $9a$, a connection from the output electrode or drain of transistor $8b$ to the drain of transistor $7a$ and a connection from the output electrode or drain of transistor $9b$ to the drain of transistor $6a$. Thus the circuit configuration of FIG. 2 corresponds to that of FIG. 1 with subcircuits 3 and 4 omitted and with the lower collectors of transistors 8 and 9 connected to the upper collectors of transistors 7 and 6 respectively (because the circuit of FIG. 2 is a divider-by-two rather than a divider-by-four). In FIG. 2 the transistors 26 and 27 of the switchable current source means are also enhancement-type insulated gate field effect transistors with their sources connected to the output of current source 24. Because the transistors 6–9 of FIG. 2 are insulated gate field effect transistors which (a) do not saturate and (b) have a quadratic characteristic (output current versus control voltage) the arrangement of FIG. 2 can be made to be substantially less susceptable to the incorrect data transfer problem described with reference to FIG. 1.

If supply terminal 30 in FIG. 2 is fed with a supply voltage which is positive with respect to terminal 25 all transistor structures will, of course, be of the n-channel type. If the circuit is integrated the resistors may be formed as polysilicon tracks. Alternatively they may be implemented as p-channel field effect transistor structures provided with a large gate-source forward voltage (when the other transistors are n-channel). The current source 24 may be constituted by the output circuit of a current mirror the input circuit of which is fed from supply terminal 30 via a high-value resistance.

Figure 2A:
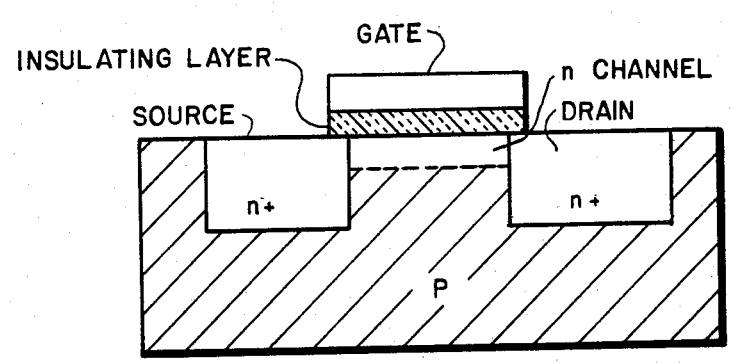

Another advantage of employing a field-effect transistors is that the characteristics of the data transfer transistors can be adjusted relative to the characteristics of the cross-coupled differential pair transistors by suitably choosing the width-to-length ratios of the channels of the various transistor structures, enabling the operation of the arrangement to be optimised for the particular application for which it is intended. In general it is found that, for sinusoidal input voltages, if the channel width-to-length ratios of the differential pair transistor structures, i.e. the transistors having the suffix a in FIG. 2, are made larger than the corresponding ratios of the data transfer transistor structures, i.e. the transistors having the suffix b in FIG. 2, the high-frequency sensitivity and the maximum operating frequency of the arrangement are increased and the low-frequency sensitivity is decreased. (The channel of a typical N type enhancement made insulated gate field-effect transistor structure is shown in FIG. 2a, and the channel length being the distance between the source and drain zones). Thus, if the arrangement of FIG. 2 is required to operate at as high a frequency as possible, the channel width-to-length ratios of the transistor structures 6a, 7a, 8a and 9a should be chosen larger than the channel width-to-length ratios of the transistor structures 6b, 7b, 8b and 9b.

It will be evident that the circuit of FIG. 2 may be extended by providing a further pair of subcircuits to obtain an arrangement similar to that shown in FIG. 1 (but now employing all insulated-gate field-effect transistor structures) and thus a frequency divider-by-four. Similar further such extensions to obtain a divider-by-six, a divider-by-eight, etc. may be made by providing two further pairs of subcircuits, three further pairs of subcircuits, etc.

What is claimed is:

1. A frequency divider circuit arrangement comprising 2n subcircuits inter-coupled to form a cyclic arrangement, where n is a positive integer, and switchable current source means, each subcircuit comprising first, second, third and fourth transistor structures each having a control electrode, an output electrode and a common electrode, in each subcircuit the output electrode of the first structure being provided with a load impedance and being coupled to the control electrodes of the second and fourth structures, the output electrode of the second structure being provided with a load impedance and being coupled to the control electrodes of the first and third structures, and the common electrodes of all four structures being connected to a common point, the inter-couplings between said subcircuits comprising, for each of said subcircuits except one; a coupling from the output electrode of the third structure of the relevant subcircuit to the output electrode of the first structure of the next subcircuit in the cyclic arrangement and a coupling from the output electrode of the fourth structure of the relevant subcircuit to the output electrode of the second structure of the next subcircuit in the cyclic arrangement, and for the other one of said subcircuits a coupling from the output electrode of the fourth structure of the relevant subcircuit to the output electrode of the first structure of the next subcircuit in the cyclic arrangement and a coupling from the output electrode of the third structure of the relevant subcircuit to the output electrode of the second structure of the next subcircuit in the cyclic arrangement, said switchable current source means having first and second outputs and being constructed to supply current thereat alternately in response to the application of an input signal to said switchable current source means, the said common points of the successive said subcircuits in the cyclic arrangement being constituted by alternate ones of said first and second outputs and an output electrode of a said first structure being coupled to an output of said circuit arrangement, characterized in that each said transistor structure is an insulated gate field-effect transistor structure, said control, output and common electrodes being gate, drain and source electrodes respectively of the relevant structures.

2. An arrangement as claimed in claim 1, characterized in that the width-to-length ratios of the channels of all the first and second transistor structures differ from the width-to-length ratios of the channels of all the third and fourth transistor structures in the same sense.

* * * * *